United States Patent
Chudzik et al.

(10) Patent No.: US 8,492,290 B2
(45) Date of Patent: Jul. 23, 2013

(54) FABRICATION OF SILICON OXIDE AND OXYNITRIDE HAVING SUB-NANOMETER THICKNESS

(75) Inventors: Michael P. Chudzik, Danbury, CT (US); Min Dai, Mahwah, NJ (US); Joseph F. Shepard, Jr., Poughkeepsie, NY (US); Shahab Siddiqui, White Plains, NY (US); Jinping Liu, Hopewell Junction, NY (US)

(73) Assignees: International Business Machines Corporation, Armonk, NY (US); Globalfoundries Inc., Grand Cayman (KY)

( * ) Notice: Subject to any disclaimer, the term of this patent is extended or adjusted under 35 U.S.C. 154(b) by 216 days.

(21) Appl. No.: 13/164,891

(22) Filed: Jun. 21, 2011

(65) Prior Publication Data

US 2012/0329230 A1  Dec. 27, 2012

(51) Int. Cl.
*H01L 21/31* (2006.01)

(52) U.S. Cl.
USPC ........... 438/765; 438/767; 438/769; 438/770; 438/786; 438/787

(58) Field of Classification Search
None
See application file for complete search history.

(56) References Cited

U.S. PATENT DOCUMENTS

| | | | |
|---|---|---|---|
| 3,508,209 A * | 4/1970 | Agusta et al. | 365/51 |
| 4,784,975 A * | 11/1988 | Hofmann et al. | 438/308 |
| 5,068,124 A | 11/1991 | Batey et al. | |
| 5,264,394 A * | 11/1993 | Ruckman et al. | 438/778 |
| 5,940,736 A | 8/1999 | Brady et al. | |
| 6,029,680 A * | 2/2000 | Hawthorne et al. | 134/1.3 |
| 6,100,149 A * | 8/2000 | Nenyei et al. | 438/308 |
| 6,436,846 B1 * | 8/2002 | Tews et al. | 438/770 |
| 6,551,946 B1 * | 4/2003 | Chen et al. | 438/770 |
| 6,638,819 B1 * | 10/2003 | Joshi et al. | 438/256 |
| 6,764,967 B2 * | 7/2004 | Pai et al. | 438/787 |
| 7,101,812 B2 * | 9/2006 | Eisele et al. | 438/769 |
| 7,560,363 B2 * | 7/2009 | Adachi et al. | 438/473 |
| 2005/0070101 A1 * | 3/2005 | Geiss et al. | 438/689 |
| 2006/0134927 A1 * | 6/2006 | Chen et al. | 438/778 |
| 2006/0138398 A1 * | 6/2006 | Shimamune et al. | 257/19 |
| 2009/0117750 A1 * | 5/2009 | OuYang et al. | 438/769 |

OTHER PUBLICATIONS

Motorola Corporation, "Surface Cleaning and Wet Processing Terminology", 1999 Arizona Board of Regents for the University of Arizona.

Virginia Semiconductor, Inc., "Wet-Chemical Etching and Cleaning of Silicon" Jan. 2003.

* cited by examiner

*Primary Examiner* — Scott B Geyer
(74) *Attorney, Agent, or Firm* — Scully, Scott, Murphy & Presser, P.C.; Yuanmin Cai (57) ABSTRACT

A method of fabricating a silicon-containing oxide layer that includes providing a chemical oxide layer on a surface of a semiconductor substrate, removing the chemical oxide layer in an oxygen-free environment at a temperature of 1000° C. or greater to provide a bare surface of the semiconductor substrate, and introducing an oxygen-containing gas at a flow rate to the bare surface of the semiconductor substrate for a first time period at the temperature of 1000° C. The temperature is then reduced to room temperature during a second time period while maintaining the flow rate of the oxygen containing gas to provide a silicon-containing oxide layer having a thickness ranging from 0.5 Å to 10 Å.

20 Claims, 4 Drawing Sheets

FABRICATION OF SILICON OXIDE AND OXYNITRIDE HAVING SUB-NANOMETER THICKNESS

BACKGROUND

The present disclosure relates generally to semiconductor devices. More particularly, the present disclosure relates to the formation of silicon-containing oxides.

In order to be able to make integrated circuits (ICs), such as memory, logic, and other devices, of higher integration density than currently feasible, one has to find ways to further downscale the dimensions of semiconductor devices, e.g., field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. As the overall size of the semiconductor devices decreases to less than 10 nm, high-k materials are widely used as dielectric, such as $HfO_2$, with an ultra thin $SiO_2$ or SiON interface layer (IL) on silicon substrate.

SUMMARY

Methods of fabricating silicon-containing oxide layers, and structures formed therefrom, are provided, in which the thickness of the silicon-containing oxide layer can be controlled to be within a range of 0.5 Å to 10 Å. In one embodiment, the method of forming the silicon-containing oxide layer includes providing a chemical oxide layer on a surface of a semiconductor substrate. The chemical oxide layer is then removed in an oxygen-free environment at a temperature of 1000° C. or greater to provide a bare surface of the semiconductor substrate. While the temperature is at 1000° C. or greater, an oxygen-containing gas is introduced to the bare surface of the semiconductor substrate for a first time period. The temperature is then reduced to room temperature during a second time period while maintaining the flow rate of the oxygen-containing gas during the first time period to provide a silicon-containing oxide layer having a thickness ranging from 0.5 Å to 10 Å.

In another embodiment, a method of forming a silicon-containing oxynitride layer is provided that includes providing a chemical oxide layer on a surface of a semiconductor substrate. The chemical oxide layer is then removed in an oxygen-free environment at a temperature of 1000° C. or greater to provide a bare surface of the semiconductor substrate. While the temperature is at 1000° C. or greater, an oxygen-containing gas is introduced to the bare surface of the semiconductor substrate for a first time period. The temperature is then reduced to room temperature during a second time period while maintaining the flow rate of the oxygen-containing gas, and a nitrogen plasma is introduced at room temperature to 800° C. without oxygen to provide a silicon-containing oxynitride layer having a thickness ranging from 0.5 Å to 10 Å.

In another aspect, a method of forming a semiconductor device is provided, in which the gate structure of the semiconductor device includes a silicon-containing oxide layer having a thickness within the range of 0.5 Å to 10 Å. In one embodiment, the method includes providing a chemical oxide layer on a surface of a semiconductor substrate. The chemical oxide layer is removed in an oxygen-free environment at a temperature of 1000° C. or greater to provide a bare surface of the semiconductor substrate. While the temperature is at 1000° C. or greater, an oxygen-containing gas is introduced to the bare surface of the semiconductor substrate to grow a silicon-containing oxide layer having a thickness ranging from 0.5 Å to 10 Å. The temperature is then reduced to room temperature while maintaining a flow rate of the oxygen-containing gas. At least one high-k gate dielectric and one gate conductor layer are then formed atop the silicon-containing oxide layer, wherein the at least one gate conductor layer and one high-k gate dielectric layer with the silicon-containing oxide layer are patterned and etched to form a gate structure. Source and drain regions are on opposing sides of the gate structure.

BRIEF DESCRIPTION OF SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Detailed embodiments of the methods and structures of the present disclosure are described herein; however, it is to be understood that the disclosed embodiments are merely illustrative of the disclosed structures and methods that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is directed towards the formation of high quality thermal silicon-containing oxide interface layers having a thickness of less than 1.0 nm. For inversion thickness scaling beyond 25 nm CMOS technology, e.g., 22 nm or less, silicon-containing oxide interface layers for high-k dielectrics, such as silicon oxide ($SiO_2$) and silicon oxynitride ($Si_3N_4$), having a thickness of less than 1.0 nm may be desirable. Manufacturable thermal oxidation and nitridation growth methods for forming oxide-containing dielectrics starting from chemical oxide typically can not provide silicon-containing oxide layers having a thickness of 15 Å or less, because the chemical oxide layer that provides the starting point of thermal oxidation and nitridation process already has a thickness that is greater than 5 Å.

The chemical oxide layer is formed by a wet chemistry cleaning processes, e.g., RCA clean, that is conducted prior to thermal oxidation and nitridation growth processes. Because the chemical oxide layer provides the initial starting point for thermal oxidation and nitridation, as well as other plasma deposition methods, the dielectric layers formed by these methods will have a minimum thickness that will be no less than the thickness of the chemical oxide layer. More specifically, because the thermal oxidation or nitridation is adding to the thickness of the chemical oxide layer, the dielectric layer provided by the chemical oxide layer and dielectric layer that is deposited on the chemical oxide layer will have a thickness equal to the chemical oxide layer plus material formed on the chemical oxide layer by the deposition process, e.g., thermal oxidation and/or nitridation. Therefore, the thickness of a dielectric layer provided by thermal oxidation and/or nitridation has to be greater than the thickness of the chemical oxide layer.

It has been determined that silicon-containing oxide layers having a thickness of less than 1.0 nm, e.g., less than 5 Å, may be provided using thermal and plasma like processes, in which the chemical oxide layer is removed from the semiconductor substrate using a desorption step at temperatures greater than 1000° C. in an oxygen-free atmosphere. Following desorption of the chemical oxide layer, a silicon-containing oxide layer may then be deposited on the bare surface of the semiconductor substrate by introducing oxygen while the semiconductor substrate is at high temperature, in which the thickness of the silicon-containing oxide layer may be controlled to have a thickness ranging from 0.5 Å to 10 Å by controlling the oxygen flow to the semiconductor substrate. The temperature of the semiconductor substrate is then reduced to room temperature while maintaining the oxygen flow rate to the semiconductor substrate. The details of this process are now described with reference to FIGS. 1-3.

Figure 1:
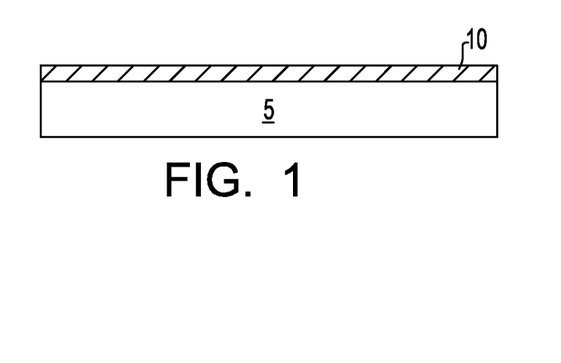
FIG. 1 is a side cross-sectional view depicting one embodiment of a chemical oxide layer on a surface of a semiconductor substrate, in accordance with the present disclosure.

FIG. 1 depicts one embodiment of a chemical oxide layer 10 that is formed on the surface of a semiconductor substrate 5. The semiconductor substrate 5 employed in the present disclosure may be composed of any silicon-containing material including, but not limited to, Si, SiGe, SiC, SiGeC and combinations thereof. The semiconductor substrate 5 may also comprise an organic semiconductor or a layered semiconductor, such as Si/SiGe, a silicon-on-insulator (SOI) or a SiGe-on-insulator (SGOI). In one example, the semiconductor substrate 5 is composed of a silicon (Si), i.e., substantially 100% silicon. Moreover, the semiconductor substrate 5 may include surfaces with any crystallographic orientation including, e.g., (100), (110), (111) or any suitable combination thereof.

The semiconductor substrate 5 may be doped, undoped or contain doped and undoped regions therein. Further, the semiconductor substrate 5 may be strained, unstrained or any combination thereof. In one embodiment, the semiconductor substrate 5 may include at least one well region. In one example, in which the semiconductor substrate 5 is processed to provide at least one n-type field effect transistor (nFET), a well region is present in the semiconductor substrate 5 doped to a p-type conductivity. In one example, in which the semiconductor substrate 5 is processed to provide at least one p-type field effect transistor (pFET), a well region may be present in the semiconductor substrate 5 that is doped to an n-type conductivity.

Still referring to FIG. 1, in one embodiment, the surface of the semiconductor substrate 5 is typically cleaned to remove any residual layers, foreign particles, and any residual metallic surface contamination, and to temporarily protect the cleaned substrate surface. During this cleaning process, the chemical oxide layer 10 may be formed on the surface of the semiconductor substrate 5.

In a first step of the cleaning process, a silicon oxide or silicon oxynitride is removed in a solution of hydrofluoric (HF) acid. HF acid is used to etch silicon oxide ($SiO_2$) films on silicon (Si) substrates, because the HF acid will etch the $SiO_2$ without attacking the Si surface. The HF acid it typically diluted with deionized (DI) water in order to slow down the etch rate of the $SiO_2$, thereby ensuring better etch uniformity. In one embodiment, the dilution ratio ranges from 1:1 $HF:H_2O$ to 300:1 $H_2O:HF$. In another embodiment, the HF acid may be diluted with ammonium fluoride ($NH_4F$).

Following the surface treatment with HF acid, the removal of particles and residual metallic contamination continues with an RCA clean. In one embodiment, the RCA clean includes a treatment of the semiconductor substrate 5 in a solution of ammonium hydroxide (NH$_4$OH) and hydrogen peroxide (H$_2$O$_2$) followed by an aqueous mixture of hydrochloric (HCl) acid and an oxidizing agent (e.g., H$_2$O$_2$, O$_3$).

The first step of the RCA clean that includes the NH$_4$OH and H$_2$O$_2$ may be referred to as "SC-1" (standard clean #1). SC-1 includes of a mixture of NH$_4$OH and H$_2$O$_2$ and DI water. A typical concentration ratio for the mix is 1:1:5 NH$_4$OH:H$_2$O$_2$:H$_2$O, although ratios as low as 0.05:1:5 are suitable for cleaning the semiconductor substrate 5. SC-1 typically operates in a temperature ranging from 50° C. to 70° C.

The second step of the RCA clean that includes the aqueous mixture of HCl acid and an oxidizing agent may be may be referred to as "SC-2" (standard clean #2). SC-2 includes a mixture of HCl acid, H$_2$O$_2$, and DI water. A typical concentration ratio for the mix is 1:1:5 HCl:H$_2$O$_2$:H$_2$O. SC-2 is typically operated in the temperature range of 50-70° C.

The above cleaning process typically forms a chemical oxide layer 10 on the surface of the semiconductor substrate 5. The cleaned substrate surface is sealed with a very thin layer of chemical oxide. The chemical oxide layer 10 may be silicon oxide (SiO$_2$), which can have a thickness ranging from 5 Å to 10 Å. In another embodiment, the chemical oxide layer 10 has a thickness ranging from 5 Å to 8 Å.

Figure 2:
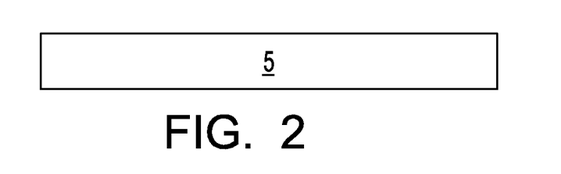
FIG. 2 is a side cross-sectional view depicting removing the chemical oxide layer from the semiconductor substrate depicted in FIG. 1, wherein the chemical oxide layer is removed in an oxygen-free environment at a temperature of 1000° C. or greater to provide a bare surface of the semiconductor substrate, in accordance with the present disclosure.

FIG. 2 depicts one embodiment of removing the chemical oxide layer 10 from the semiconductor substrate 5 depicted in FIG. 1, wherein the chemical oxide layer 10 is removed in an oxygen-free environment at a temperature of 1000° C. or greater to provide a bare surface of the semiconductor substrate 5. By "bare surface" it is meant that the exposed surface of the semiconductor substrate 5 is free of oxide. In one embodiment, the oxygen content of the bare surface is less than 1%. In another embodiment, the oxygen content of the bare surface is less that 0.5%. At temperatures greater than 1000° C., the chemical oxide layer 10 decomposes and is desorbed from the surface of the semiconductor substrate 5. By "desorbed" it is meant that the chemical oxide layer 10 changes from an adsorbed state on a surface of the semiconductor substrate 5 to a gaseous or liquid state.

In one embodiment, the chemical oxide layer 10 is removed by increasing the temperature of the chemical oxide layer 10 to greater than 1000° C. using an annealing process. In one embodiment, annealing may be provided by a thermal anneal, a rapid thermal anneal, a laser anneal or combinations thereof. Annealing is at a temperature ranging from 1000° C. to 1250° C. In another embodiment, the temperature of the anneal ranges from 1150° C. to 1300° C. In yet another embodiment, the temperature of the anneal ranges from 1200° C. to 1250° C.

By "oxygen-free" is it meant that the annealing atmosphere does not contain oxygen-forming elements, such as oxygen (O$_2$) gas. To provide an oxygen-free environment, the chemical oxide layer 10 may be heated in a controlled chamber. In some embodiments, the annealing atmosphere comprises an inert gas such as nitrogen (N$_2$) or argon (Ar) or a combination thereof. In one embodiment, the inert gas environment may be composed of nitrogen (N$_2$) gas at a pressure of 1.5 torr. In another embodiment, the inert gas environment may be composed of a nitrogen (N$_2$) gas at a pressure of ranging from 0 torr to 740 torr, but preferably less than 10 torr. In yet another embodiment, the inert gas environment may be composed of nitrogen (N$_2$) gas at a pressure of ranging from 0 torr to 10 torr. As indicated above, the inert gas environment does not contain oxygen-forming elements, therefore the partial pressure of oxygen during the anneal to remove the chemical oxide layer 10 is 0.0 torr.

The annealing at temperatures greater than 1000° C. in an oxygen-free environment may continue until the chemical oxide layer 10 is entirely removed from the semiconductor substrate 5. In one embodiment, the time period of the annealing process to remove the chemical oxide layer 10 may range from 5 seconds to 100 seconds. In another embodiment, the time period of the annealing process to remove the chemical oxide layer 10 may range from 5 seconds to 10 seconds. In one embodiment, following the anneal process, the bare surface of the semiconductor substrate is 100% free of oxide.

Figure 3:
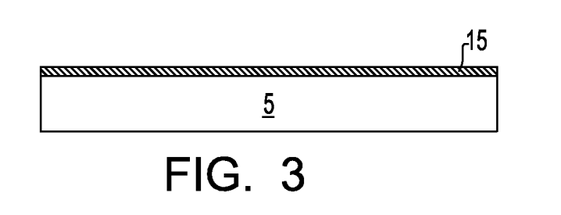
FIG. 3 is a side cross-sectional view depicting forming a silicon-containing oxide layer having a thickness ranging from 0.5 Å to 10 Å on the bare surface of the semiconductor substrate depicted in FIG. 2, in accordance with one embodiment of the present disclosure.

FIG. 3 depicts one embodiment of forming a silicon-containing oxide layer 15 having a thickness ranging from 0.5 Å to 10 Å on the bare surface of the semiconductor substrate 5. In one embodiment, while maintaining the annealing temperature of 1000° C., an oxygen-containing gas is introduced to the bare surface of the semiconductor substrate 5. In one embodiment, the oxygen-containing gas includes oxygen O$_2$ gas and an inert gas selected from the group consisting of argon (Ar), nitrogen (N$_2$) and a combination thereof. In one example, the oxygen-containing gas is composed of an N$_2$/O$_2$ mixture. The ratio between O$_2$ and N$_2$ ranges from 0 to 100%.

In one embodiment, by changing the oxygen partial pressure, the thickness of the silicon-containing oxide layer 15 can be precisely controlled from 0.5 Å to 10 Å. In one embodiment, the flow rate of the oxygen-containing gas introduced to the bare surface of the semiconductor substrate 5 at a temperature of 1000° C. is selected to provide an oxygen partial pressure ranging from 0 torr to 1.5 torr or higher. In another embodiment, the oxygen partial pressure ranges from 0 torr to 0.02 torr.

The temperature is maintained at greater than 1000° C. for a first time period ranging from 5 seconds to 100 seconds, while the oxygen-containing gas is introduced to the bare surface of the semiconductor substrate 5. In another embodiment, the temperature is maintained at 1000° C. for a first time period ranging from 5 seconds to 10 seconds, while the oxygen-containing gas is introduced to the bare surface of the semiconductor substrate 5.

In one example, while maintaining the annealing temperature of 1000° C., a silicon-containing oxide layer 15 having a thickness of less than 10 Å grows by an oxygen-containing gas that is introduced to the bare surface of the semiconductor substrate 5 for a time period of 10 to 30 seconds, wherein the oxygen-containing gas is an N$_2$/O$_2$ mixture at a pressure of about 1 torr.

Still referring to FIG. 3, the temperature of the annealing process is then reduced from greater than 1000° C. to room temperature. As used herein, "room temperature" ranges from 20° C. or 25° C. During the time period, i.e., second time period, that the temperature is reduced to room temperature, the flow rate of the oxygen-containing gas is maintained to be the same as the flow rate of the oxygen-containing gas during the first time period. Similar to the oxygen-containing gas employed during the first time period, i.e., the time period at which the bare surface of the semiconductor substrate 5 is treated with an oxygen-containing gas at a temperature of 1000° C., the oxygen-containing gas that is employed in the second time period, i.e., cooling time period, may include a mixture of oxygen (O$_2$) gas and an inert gas selected from the group consisting of argon (Ar), nitrogen (N$_2$) and a combination thereof. In one embodiment, while the semiconductor substrate 5 is cooling to room temperature, the flow rate of the oxygen-containing gas may range from 0 sccm to 100 sccm for O$_2$ and 0 sccm to 5000 sccm for inert gas such as N$_2$. Maintaining the flow rate of the oxygen-containing gas during cooling of the semiconductor substrate 5 to room temperature may include a flow rate of the oxygen-containing gas that provides an oxygen partial ranging from 0 torr to 1.5 torr. In some examples, the flow rate of the oxygen-containing gas provides an oxygen partial pressure that is greater than 1.5 torr. In another embodiment, the oxygen partial pressure during cooling of the semiconductor substrate 5 to room temperature ranges from 0 torr to 0.2 torr. In one example, the oxygen-containing gas that is employed during the cooling of the semiconductor substrate to room temperature is an $N_2/O_2$ gas mixture.

The time period, i.e., second time period, for cooling the semiconductor substrate 5 from temperatures greater than 1000° C. to room temperature may range from 5 seconds to 120 seconds. In one example, the cooling period of the semiconductor substrate 5 from temperatures greater than 1000° C. to room temperature is greater than 100 seconds. In another embodiment, the time period, i.e., second time period, for cooling the semiconductor substrate 5 from temperatures greater than 1000° C. to room temperature may range from 20 seconds to 60 seconds.

In one embodiment, the above-described process provides a silicon-containing oxide layer 15 having a thickness that ranges from 0.5 Å to 10.0 Å. In another embodiment, a silicon-containing oxide layer 15 is provided having a thickness ranging from 1.0 Å to 8.0 Å. In yet another embodiment, a silicon-containing oxide layer 15 is provided having a thickness ranging from 2.0 Å to 6.0 Å, e.g., less than 5.0 Å.

Figure 4:
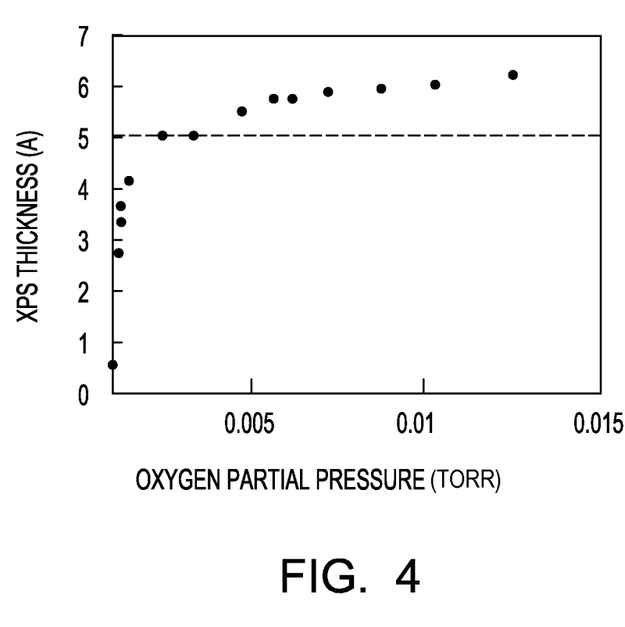
FIG. 4 is a plot of the thickness of the silicon-containing oxide layer as a function of the oxygen partial pressure of the oxygen-containing gas, in accordance with one embodiment of the present disclosure.

Using the above-described method, the thickness of the silicon-containing oxide layer 15 may be controlled by adjusting the oxygen partial pressure of the oxygen-containing gas. For example, to increase the thickness of the silicon-containing oxide layer 15, the oxygen partial pressure is increased, and to decrease the thickness of the silicon-containing oxide layer 15, the oxygen partial pressure is decreased. FIG. 4 is a plot of the oxygen partial pressure of the oxygen-containing gas that is applied to the bare surface of the semiconductor substrate 5 versus the thickness of the silicon-containing oxide layer 15. As depicted in FIG. 4, as the oxygen partial pressure increases from 0.001 torr to 0.0125 torr, the thickness of the silicon-containing oxide layer 15 increases from 0.5 Å to 6 Å. In one embodiment, by changing the oxygen partial pressure, the thickness of the silicon-containing oxide layer 15 can be precisely controlled from 0.5 Å to 10 Å.

In the above-described embodiment, the silicon-containing oxide layer 15 is typically composed of silicon oxide ($SiO_2$), in which the silicon (Si %/(Si+O)) ranges from 20% to 50%. In another embodiment, the present disclosure provides a method of forming a silicon oxynitride-containing layer. The method of forming the silicon-containing oxynitride layer may begin with an initial process sequence that provides a chemical oxide layer on a surface of a semiconductor substrate. The chemical oxide layer used in the method for forming the silicon-containing oxynitride layer is similar to the chemical oxide layer 10 for forming the silicon-containing oxide layer that is described above with reference to FIG. 1. The chemical oxide layer is then removed in an oxygen-free environment at a temperature of 1000° C. or greater to provide a bare surface of the semiconductor substrate. The method of removing the chemical oxide layer 10 is described above with reference to FIG. 2.

Thereafter, the silicon-containing oxynitride layer is formed on the bare surface of the semiconductor substrate. In one embodiment, the silicon-containing oxynitride layer is formed by a two-stage process. In the first stage of the two-stage process for forming the silicon-containing oxynitride layer, an oxygen-containing gas is introduced at a flow rate to the bare surface of the semiconductor substrate for a first time period at the temperature of 1000° C. or greater. In the second stage of the two-stage process for forming the silicon-containing oxynitride layer, the temperature is reduced to room temperature during a second time period while maintaining the flow rate of the oxygen containing gas of the first time period during the second time period. Nitrogen plasma is mixed with the oxygen containing gas during the second time period to form a silicon containing oxynitride layer having a thickness ranging from 0.5 Å to 10 Å. The details of the two-stage process are now described in greater detail.

In the first stage, the temperature of the semiconductor substrate is maintained at greater than 1000° C., wherein the time period during which the temperature is maintained at greater than 1000° C. is referred to as the first time period. In the second stage, the temperature of the semiconductor substrate is reduced to room temperature, while the gas flow of the oxygen-containing gas that was introduced during the first time period is maintained, and a nitrogen plasma is introduced to the gas flow. In this embodiment, by "maintained" it is meant that the oxygen gas flow during the first time period is the same as the oxygen gas flow that is employed during the time period at which the temperature of the semiconductor substrate is cooling to room temperature. The time period during which the temperature of the semiconductor substrate is cooling to room temperature may be referred to as a second time period.

The gas flow used to form the silicon-containing oxynitride layer is similar to the oxygen-containing gas that provides the silicon-containing oxide layer 15 that is described above with reference to FIG. 3, with the exception that the gas flow during the second stage further includes a plasma of nitrogen. For example, the gas flow including the oxygen-containing gas and the nitrogen plasma may further include an inert gas that is selected from the group consisting of argon (Ar), nitrogen ($N_2$) and a combination thereof. Differentiated from the inert nitrogen ($N_2$) gas, a nitrogen plasma includes reactive nitrogen ions. A plasma is a state of matter similar to gas in which a certain portion of the particles are ionized by plasma generator, i.e., to positive ions and negative electrons. In one embodiment, the nitrogen plasma provides a nitrogen dose ranging from $5\times10^{14}$ atoms/$cm^2$ to $5\times10^{15}$ atoms/$cm^2$. The plasma treatment is introduced to the oxygen containing gas flow. The $N_2$ flow rate ranges from 0 sccm to 2000 sccm, and when mixed in a Ar gas ranges from 0 sccm to 3000 sccm, during the plasma generation/niridation. The total pressure ranges from 0.2 torr to 2 torr.

In the first stage, in which the gas flow of the oxygen-containing gas is introduced to the bare surface of the semiconductor substrate 5, and the temperature is maintained at greater than 1000° C., the first time period may range from 10 seconds to 120 seconds. In another embodiment, the temperature is maintained at 1000° C. for a first time period ranges from 10 seconds to 30 seconds. In the second stage, during which the temperature of the annealing process is reduced to room temperature, and the nitrogen plasma is introduced to the oxygen-containing gas flow, the second time period may range from 10 seconds to 100 seconds in an oxygen free ambient, at temperature ranging from room temperature (20° C.-25° C.) to 800° C. In one example, the second time period may be greater than 100 seconds. In another embodiment, the second time period may range from 20 seconds to 60 seconds.

In another embodiment, the silicon-containing oxynitride layer may be formed with a three-stage process. The first and second stages of the three-stage process to form the silicon-containing oxynitride layer provide a silicon-containing oxide layer having a thickness that ranges from 0.5 Å to 10.0 Å. In the third stage of the three-stage process for forming the silicon-containing oxynitride layer, the silicon-containing oxide layer is converted to a silicon-containing oxynitride layer by the application of a nitrogen plasma. The details of the three-stage process for forming the silicon-containing oxynitride layer are now described in greater detail.

In one embodiment, during the first stage of the three-stage process to form the silicon-containing oxynitride layer on the bare surface of the semiconductor substrate, a gas flow is introduced to the semiconductor substrate that includes an oxygen-containing gas to the bare surface of the semiconductor substrate at the temperature of 1000° C. In the first stage, the temperature of the semiconductor substrate is maintained at greater than 1000° C., wherein the time period during which the temperature is maintained at greater than 1000° C. is referred to as the first time period. In the first stage during which the gas flow of the oxygen-containing gas is introduced to the bare surface of the semiconductor substrate 5, and the temperature is maintained at greater than 1000° C., the first time period may range from 10 seconds to 120 seconds. In another embodiment, the temperature is maintained at 1000° C. for a first time period that ranges from 10 seconds to 30 seconds.

In the second stage of the three-stage process to form the silicon-containing oxynitride layer, the temperature of the semiconductor substrate is reduced to room temperature, while the gas flow of the oxygen-containing that was introduced during the first time period is maintained. By "maintained" it is meant that the gas flow during the first time period is the same as the gas flow that is employed during the time period at which the temperature of the semiconductor substrate is cooling to room temperature. The time period during which the temperature of the semiconductor substrate is cooling to room temperature may be referred to as a second time period. During the second time period, the temperature of the annealing process is reduced to room temperature, e.g., 20° C. to 25° C. The second time period for cooling the semiconductor substrate 5 from temperatures greater than 1000° C. to room temperature may range from 10 seconds to 100 seconds. In one example, the second time period for cooling the semiconductor substrate may be longer than 100 seconds. In another embodiment, the time period, i.e., second time period, for cooling the semiconductor substrate 5 to room temperature may range from 20 seconds to 60 seconds.

In one embodiment, the above-described first and second stages of the three-stage process for forming a silicon-containing oxynitride layer form a silicon-containing oxide layer having a thickness that ranges from 0.5 Å to 10.0 Å. The gas flow used to form the silicon-containing oxide layer in the first and second stages of the three-stage process for forming the silicon-containing oxynitride layer is similar to the oxygen-containing gas that provides the silicon-containing oxide layer 15 that is described above with reference to FIG. 3.

In the third stage of the three-stage process for forming a silicon-containing oxynitride layer, after the semiconductor substrate has been cooled to room temperature, a nitrogen plasma is introduced to the surface of the silicon-containing oxide layer to convert the silicon-containing oxide layer to a silicon-containing oxynitride layer. The nitrogen plasma may be applied to the silicon-containing oxide layer at a temperature that ranges from room temperature to 850° C. In one embodiment, the nitrogen plasma that converts the silicon-containing oxide layer into the silicon-containing oxynitride layer during the third stage may further include an inert gas that is selected from the group consisting of argon (Ar), nitrogen ($N_2$) and a combination thereof. Differentiated from the inert nitrogen ($N_2$) gas, a nitrogen plasma includes reactive nitrogen ions. A plasma is a state of matter similar to gas in which a certain portion of the particles are ionized by plasma generator, i.e., to positive ions and negative electrons. In one embodiment, the nitrogen plasma provides a nitrogen dose ranging from $5 \times 10^{14}$ atoms/cm$^2$ to $5 \times 10^{15}$ atoms/cm$^2$. In one embodiment, the $N_2$ flow rate ranges from 0 sccm to 2000 sccm, and when mixed in an Ar gas ranges from 0 sccm to 3000 sccm during the plasma generation/nitridation. The total pressure ranges from 0.2 torr to 2 torr. In one embodiment, the nitrogen plasma is an independent treatment, in which the gas flow and pressure is not correlated to the gas flow of the oxygen-containing gas that provides the silicon-containing oxide layer. The time period (hereafter referred to as "third time period") of the third stage of the three-stage process to form the during which the nitrogen plasma is applied to the silicon containing oxide layer may range from 10 seconds to 100 seconds. In another embodiment, the third time period may range from 20 seconds to 60 seconds.

Using the above-described two-stage and three-stage methods, the thickness of the silicon-containing oxynitride layer may be controlled by adjusting the oxygen partial pressure of the gas flow of the oxygen-containing gas and the nitrogen plasma condition. For example, to increase the thickness of the silicon-containing oxynitride layer, the oxygen partial pressure is increased, and to decrease the thickness of the silicon-containing oxynitride layer, the oxygen partial pressure is decreased. In one embodiment, by changing the oxygen partial pressure, the thickness of the silicon-containing oxynitride layer can be precisely controlled from 0.5 Å to 10 Å. By changing the strength or plasma nitridation, i.e., increase the $N_2$ flow or temperature, the oxynitride thickness will be increased and N % will be increased also. In another embodiment, the thickness of the silicon-containing oxynitride layer may be further reduced by high temperature annealing in an inert atmosphere. For example, the thickness of the silicon-containing oxynitride layer may be further reduced by annealing in argon at a temperature ranging from 100° C. to 1250° C.

The silicon-containing oxynitride layer may include a silicon (Si) content ranging from 25% to 35%, a nitrogen (N) content ranging from 0% to 45% and higher, and an oxygen (O) content ranging from 20% to 70%. In another embodiment, the silicon-containing oxynitride layer may include a silicon (Si) content ranging from 27% to 33%, a nitrogen (N) content ranging from 5% to 40%, and an oxygen (O) content ranging from 25% to 68%.

Figure 5:
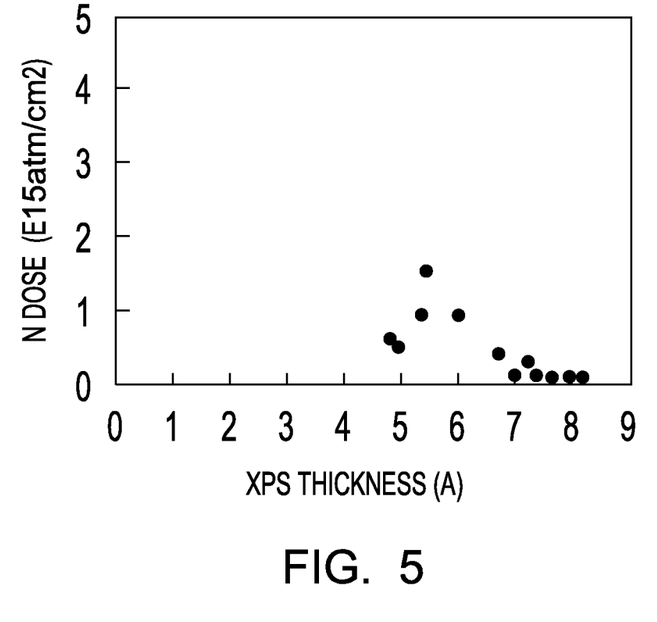
FIG. 5 is a plot of the thickness of a silicon oxynitride layer vs. the nitrogen dose present in the oxygen-containing gas, in accordance with one embodiment of the present disclosure.

FIG. 5 is a plot of the thickness of a silicon oxynitride layer versus the nitrogen dose present in the oxygen-containing gas. The x-axis of the plot is the thickness of the silicon oxynitride layer that is measured by x-ray photoelectron spectroscopy (XPS), and the y-axis is the dose of nitrogen provided by the gas flow of the oxygen-containing gas and the nitrogen plasma. A wide process window is covered and N dose/thickness can be precisely controlled.

Figure 6:
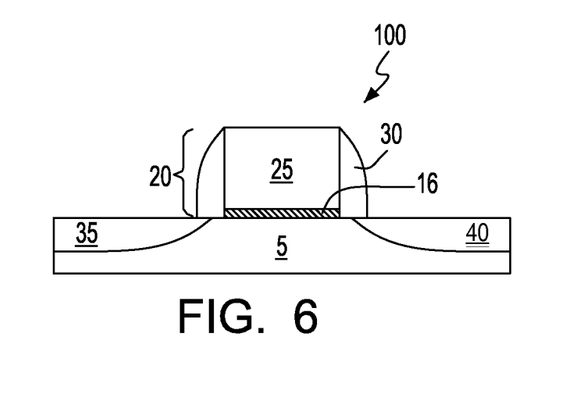
FIG. 6 is a side cross-sectional view depicting a semiconductor device, in which the gate structure of the semiconductor device includes a high-k gate dielectric composed of silicon-containing oxide interface layer having a thickness ranging from 0.5 Å to 10 Å, in accordance with one embodiment of the present disclosure.

FIG. 6 depicts a semiconductor device 100, in which the gate structure 20 of the semiconductor device includes a gate dielectric 16 composed of at least one of the silicon-containing oxide interface layer or the silicon-containing oxynitride interface layer formed using the above-described methods, with high-k dielectrics on top of it. The gate dielectric 16 may have a thickness ranging from 0.5 Å to 10 Å. The following description for forming the semiconductor device 100 may begin with the structure depicted in FIG. 3, which includes a silicon-containing oxide layer 15. Although, the semiconductor device 100 is described as employing the silicon-containing oxide layer 15 as the gate dielectric 16 that is depicted in FIG. 6, the present disclosure is not limited to only this embodiment, as the gate dielectric 16 may also be composed of a silicon-containing oxynitride layer.

FIG. 6 depicts one embodiment of a field effect transistor. A field effect transistor is a semiconductor device in which output current, i.e., source-drain current, is controlled by the voltage applied to a gate structure 20. A field effect transistor has three terminals, i.e., gate structure 20, source region 35 and drain region 40. The gate structure 20 is a structure used to control output current, i.e., flow of carriers in the channel, of the field effect transistor, through electrical or magnetic fields. The channel region is the region between the source region 35 and the drain region 40 of the field effect transistor that becomes conductive when the device is turned on. The source region 35 is a doped region in the field effect transistor, in which majority carriers are flowing into the channel. The drain region 40 is a doped region in the field effect transistor located at the end of the channel region, in which carriers are flowing out of the device through the drain region 40.

The gate structure 20 includes at least one gate conductor 25 and at least one gate dielectric 16. The at least one gate dielectric 16 may include a high-k dielectric layer and at least one of a silicon-containing oxide layer or a silicon-containing oxynitride layer having a thickness ranging from 0.5 Å to 10 Å, which the silicon-containing oxide layer or the silicon-containing oxynitride layer provides an interface layer of the at least one gate dielectric 16 that is between the semiconductor substrate 5 and the high-k gate dielectric layer. The gate structure 20 may be formed using deposition, photolithography and selective etch processes. A gate layer stack is formed on the semiconductor substrate 5 by depositing a gate conductor material layer on the silicon oxide-containing layer 15 that is depicted in FIG. 3.

Referring back to FIG. 6, the gate layer stack is then patterned and etched to provide the gate structure 20. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions.

The at least one gate conductor 25 may be composed of conductive materials including, but not limited to, metals, metal alloys, metal nitrides and metal silicides, as well as laminates thereof and composites thereof. In one embodiment, the at least one gate conductor 25 may be any conductive metal including, but not limited to, W, Ni, Ti, Mo, Ta, Cu, Pt, Ag, Au, Ru, Ir, Rh, and Re, and alloys that include at least one of the aforementioned conductive elemental metals. The at least one gate conductor 25 may also comprise doped polysilicon and/or polysilicon-germanium alloy materials (i.e., having a dopant concentration from 1E18 to 1E22 dopant atoms per cubic centimeter) and polycide materials (doped polysilicon/metal silicide stack materials). The material layer for the at least one gate conductor 25 may be formed using a deposition method including, but not limited to, salicide methods, atomic layer deposition methods, chemical vapor deposition methods and physical vapor deposition methods, such as, but not limited to, evaporative methods and sputtering methods. Although the at least one gate conductor 25 is depicted in FIG. 6 as a single layer, embodiments have been contemplated in which the at least one gate conductor 25 is a multi-layered structure of conductive materials.

In another embodiment, the dielectric layer 16 may further include a high-k dielectric between the at least one gate conductor 25 and the silicon oxide-containing layer or the silicon oxynitride-containing layer. A high-k dielectric material has a dielectric constant that is greater than the dielectric constant of silicon oxide ($SiO_2$). In one embodiment, a high-k dielectric material has a dielectric constant that is greater than 4.0. The high-k dielectric materials may include, but are not limited to, hafnium oxides, hafnium silicates, titanium oxides, barium-strontium-titantates (BSTs) and lead-zirconate-titanates (PZTs). In some examples, the high-k dielectric material may include $HfO_2$, $La_2O_3$, $Al_2O_3$, $TiO_2$, $ZrO_2$ and combinations thereof, with additional necessary post treatment, such as nitridation and anneal.

Still referring to FIG. 6, following the formation of the gate structure 20, a source region 35 and a drain region 40 may be formed in the semiconductor substrate 5 on opposing sides of the gate structure 20. Each source and drain region 35, 40 may include at least one of an extension region, a deep implant region, and an epitaxially grown raised region. In one embodiment, at least a portion of the source region 35 and the drain region 40 are ion implanted into the semiconductor substrate 5. At least one spacer 30 may be formed adjacent to the sidewall of the gate structure 20 to dictate the distance of the implanted regions from the channel portion of the field effect transistor.

For producing an n-type field effect transistor (NFET) devices, group V elements from the Periodic Table of Elements are implanted into a semiconductor substrate 5 that is composed of a group IV element of the periodic table of elements. For producing a p-type field effect transistor (PFET) devices, group III elements from the Periodic Table of Elements are implanted into a semiconductor substrate 5 that is composed of a group IV element of the periodic table of elements. In one embodiment, the source region 35 and the drain region 40 may be activated using a thermal anneal. The anneal process may be provided by thermal anneal, such as a furnace anneal, rapid thermal anneal or laser anneal. In one example, the temperature of the anneal process to activate the dopant of the source region 35 and the drain region 40 ranges from 700° C. to 1100° C.

The silicon oxide-containing layer and the silicon oxynitride-containing layer that are provided by the present disclosure are high quality interface layer for high-k dielectrics, i.e., low leakage interface dielectrics, having a thickness that may range from 0.5 Å to 10 Å. Some electrical any physical properties of the silicon oxide-containing layer and the silicon oxynitride-containing layer that are formed in accordance with the present disclosure are now discussed in the following examples. It is noted that the following examples are for illustrative purposes only and are not intended to limit the present disclosure.

EXAMPLES

Figure 7:
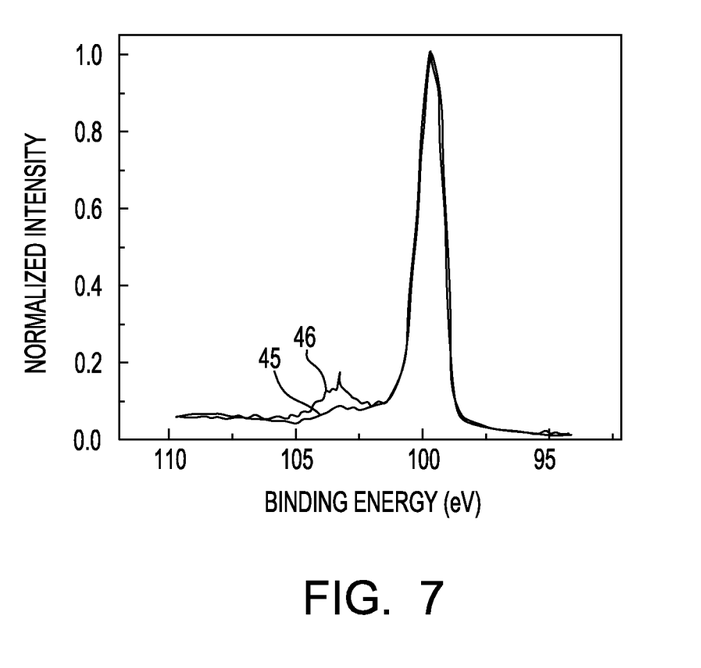
FIG. 7 is a plot of the Si 2p XPS spectra for a silicon-containing oxide layer having a thickness of approximately 2.5 Å, and a chemical oxide layer having a thickness of approximately 5.5 Å.

FIG. 7 is a plot of the Si 2p XPS spectra for a silicon-containing oxide layer (plot 45) having a thickness of approximately 2.5 Å, and a chemical oxide layer (plot 46) having a thickness of approximately 5.5 Å. The chemical oxide layer that provided plot 46 is a silicon oxide ($SiO_2$) layer formed atop a semiconductor substrate of silicon. The chemical oxide layer was formed on the semiconductor substrate by the combination of an HF acid surface treatment followed by an RCA clean, in which the RCA clean included both SC-1 and SC-2 cleaning processes, as described above with reference to FIG. 1.

The silicon-containing oxide layer that provides plot 45 was formed by removing a chemical oxide layer from a semiconductor substrate using a desorption step at temperatures greater than 1000° C. in an oxygen-free atmosphere. The details of the desorption step are described above with reference to FIG. 2. Specifically, to provide the silicon-containing oxide layer 45, a chemical oxide layer having a thickness of 5 Å to 6 Å was removed from a semiconductor substrate at a temperature of 1000° C. in a nitrogen gas $N_2$ atmosphere at a pressure of 1.5 torr during a time period of 10 seconds.

Following desorption of the chemical oxide layer, the silicon-containing oxide layer that provides plot 45 was deposited on the bare surface of the semiconductor substrate by introducing an oxygen gas while the semiconductor substrate was at high temperatures, e.g., greater than 1000° C., in which the thickness of the silicon-containing oxide was controlled to have a thickness ranging from 0.5 Å to 10 Å by controlling the oxygen partial pressure to the semiconductor substrate. The temperature of the semiconductor substrate was then reduced to room temperature while maintaining the oxygen flow rate to the semiconductor substrate. The details of the deposition step for the silicon-containing oxide layer are described above with reference to FIG. 3. Specifically, to provide the silicon-containing oxide layer having the 2.5 Å thickness, the silicon-containing oxide layer was deposited from an oxygen-containing gas composed of $O_2/N_2$ at a pressure of approximately 1.5 torr for a time period of approximately 30 seconds after 10 seconds of oxygen-free environment anneal (chemical oxide removal). The temperature is maintained at 1000° C.

Referring to FIG. 7, XPS Si 2s spectra, a small peak in plot 45 is present at about 100 eV that results from a Si—O bond, which confirms that the oxide thickness of the silicon-containing oxide layer that was provided by the present method was less than the thickness of the chemical oxide layer (plot 46) that was formed by RCA cleaning.

Figure 8:
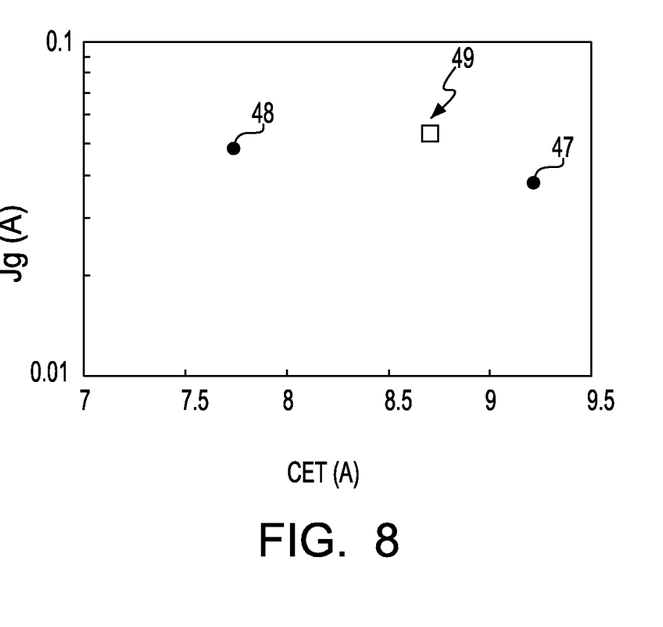
FIG. 8 is a plot of capacitance equivalent thickness (CET) vs. leakage current for a chemical oxide layer having a thickness of approximately 5.5 Å, a silicon-containing oxide layer having a thickness of approximately 3 Å, and a silicon-containing oxynitride layer having a thickness of approximately 5 Å.

FIG. 8 is a plot of capacitance equivalent thickness (CET) vs. leakage current for a chemical oxide layer (plot 47) having a thickness of approximately 5.5 Å, a silicon-containing oxide layer (plot 48) having a thickness of approximately 3 Å, and a silicon-containing oxynitride layer (plot 49) having a thickness of approximately 5 Å. To provide the plots 47, 48, 49 that are depicted in FIG. 8, capacitor structures were formed. Each of the capacitor structures included a 20 Å thick hafnium oxide ($HfO_2$) on the top of the silicon-containing oxide having a thickness ranging from 0.5 Å to 10 Å. Additionally, each of the capacitor structures were treated with a nitridation and post nitridation nitrogen anneal ($N_2$) anneal at 750° C.

The capacitor structure that provided plot 47 included a chemical oxide layer of silicon oxide ($SiO_2$) having a thickness of 5.5 Å that was formed using the same method that formed the chemical oxide layer that provided plot 46 of FIG. 7 with 20 Å layer of nitridized/annealed $HfO_2$. The semiconductor substrate provided the back electrode of the capacitor, and a top electrode of a conductive metal was deposited on the gate dielectrics. The capacitor structure that provided plot 48 included a silicon-containing oxide layer of silicon oxide ($SiO_2$) having a thickness of 3 Å that was formed using the same method that provided the silicon-containing oxide layer in plot 45 of FIG. 7. The semiconductor substrate provided the back electrode of the capacitor, and a top electrode of a conductive metal was deposited on the silicon-containing oxide layer. The capacitor structure that provided plot 48 included a silicon-containing oxynitride layer of silicon oxynitride (SiON) having a thickness of 5.5 Å that was formed using a similar method to the method that formed the silicon-containing oxide layer that provided plot 47 of FIG. 7, with the exception that a nitrogen plasma following the oxygen-containing gas to deposit the silicon containing oxynitride layer. Specifically, the nitrogen plasma included a flow rate of 80 sccm nitrogen ($N_2$) at a pressure of 0.2 torr. The semiconductor substrate provided the back electrode of the capacitor, and a top electrode of a conductive metal was deposited on the silicon-containing oxide layer.

A DC voltage ranging from −2 volts to 2 volts was applied to the capacitors, and a capacitance was measured therefrom. As indicated in plot 8, the CET (capacitance equivalent silicon oxide thickness) and the leakage current (Jg) of the capacitors formed from the silicon-containing oxide interface layer and silicon-containing oxynitride interface layer with 20 A $HfO_2$ was comparable the leakage current (Jg) of the capacitor formed from the chemical oxide layer with much reduced CET, in which the equivalent thickness of the silicon-containing oxide layer and silicon-containing oxynitride layer was less than the thickness of the chemical oxide layer.

Figure 9:
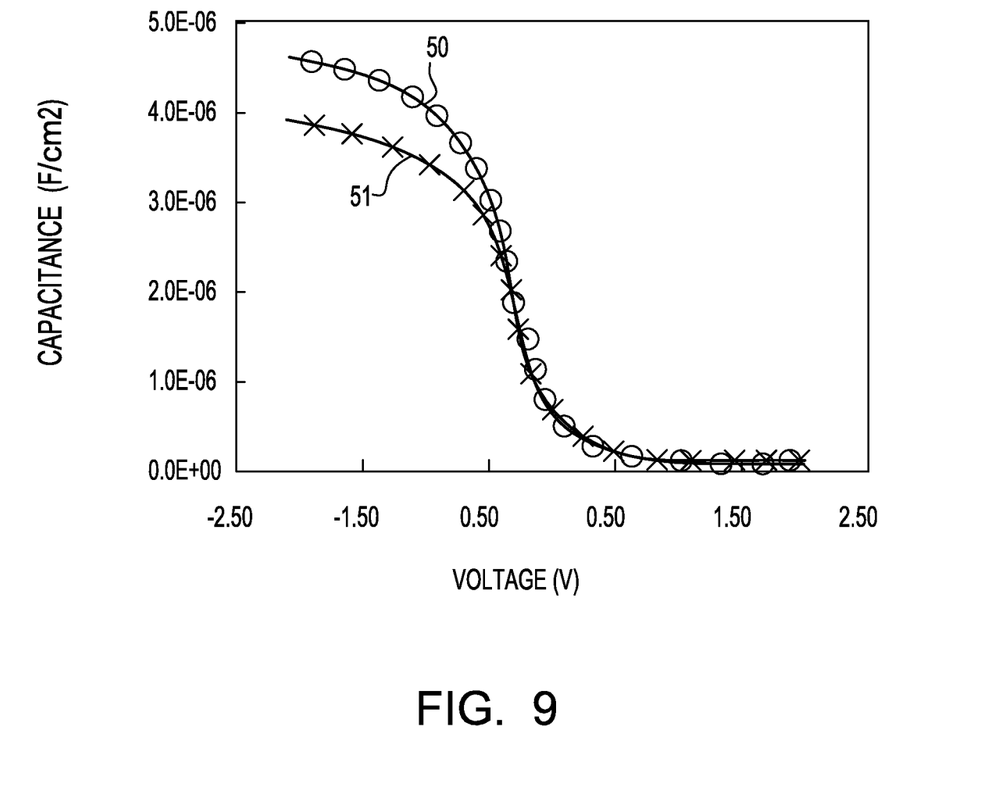
FIG. 9 is a capacitance-voltage (C-V) plot generated from the capacitors including a silicon-containing oxide layer formed in accordance with the present disclosure, and a capacitor including a chemical oxide layer formed using an RCA cleaning process.

FIG. 9 is a capacitance-voltage (C-V) plot generated from the capacitors that provided plots 47 and 48 in FIG. 9. Plot 50 is a C-V plot of a capacitor including a silicon-containing oxide interface layer having a thickness of 2.5 Å formed with 20 A $HfO_2$ in accordance with the methods of present disclosure. Plot 51 is a C-V plot of a capacitor including a chemical oxide interface layer formed using an RCA cleaning process having a thickness of 5.5 Å, with 20 A $HfO_2$, which provides a comparative example. Referring to FIG. 9, the capacitor (plot 50) including the silicon-containing oxide layer having a thickness of 2.5 Å had a greater capacitance at higher voltages than the capacitor (plot) 51 including the chemical oxide layer with a thickness of 5.5 Å indicating that the quality of the silicon-containing oxide layer formed by the present method is greater than the chemical oxide layer formed using RCA cleans and with higher effective k value.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of fabricating a silicon-containing oxide layer comprising:
   providing a chemical oxide layer on a surface of a semiconductor substrate;
   removing the chemical oxide layer in an oxygen-free environment at a temperature of 1000° C. or greater to provide a bare surface of the semiconductor substrate;
   introducing an oxygen-containing gas at a flow rate to the bare surface of the semiconductor substrate for a first time period at the temperature of 1000° C. or greater; and
   reducing the temperature to room temperature during a second time period while maintaining the flow rate of the oxygen containing gas of the first time period during the second time period to provide the silicon-containing oxide layer having a thickness ranging from 0.5 Å to 10 Å.

2. The method of claim 1, wherein the semiconductor substrate comprises a silicon-containing material selected from the group consisting of Si, SiGe, SiC, SiGeC, and combinations thereof.

3. The method of claim 1, wherein providing the chemical oxide layer comprises cleaning the semiconductor substrate with a solution of ammonium hydroxide ($NH_4OH$) and hydrogen peroxide ($H_2O_2$) followed by an aqueous mixture of hydrochloric acid (HCl) and an oxidizing agent selected from the group consisting of $H_2O_2$, $O_3$ and combinations thereof.

4. The method of claim 1, wherein the chemical oxide layer has a thickness of 10 Å or less.

5. The method of claim 1, wherein the removing the chemical oxide layer in the oxygen-free environment comprises an $O_2$ partial pressure of 0.0 torr, wherein the temperature of 1000° C. or greater is provided by annealing in an inert gas environment comprised of inert selected from the group consisting of argon gas, nitrogen ($N_2$) gas and a combination thereof.

6. The method of claim 5, wherein the inert gas environment comprises nitrogen ($N_2$) gas at 1.5 torr, and the time period of the annealing process ranges from 5 seconds to 100 seconds.

7. The method of claim 1, wherein the bare surface of the semiconductor substrate is 100% free of oxide.

8. The method of claim 1, wherein the oxygen-containing gas comprises oxygen ($O_2$) gas and an inert gas selected from the group consisting of argon, nitrogen and a combination thereof, wherein the flow rate of the oxygen-containing gas during the first time period provides an oxygen partial pressure ranging from 0 torr to 1.5 torr.

9. The method of claim 8, wherein the flow rate of the oxygen-containing gas ranges from 0 sccm to 100 sccm for $O_2$ and 0 sccm to 5000 sccm for inert gas.

10. The method of claim 9, wherein the first time period ranges from 10 seconds to 60 seconds.

11. The method of claim 10, wherein the second time period ranges from 5 seconds to 120 seconds.

12. The method of claim 11, wherein the maintaining of the flow rate of the oxygen containing gas in the second time period comprises the oxygen-containing gas comprised of the oxygen ($O_2$) gas and the inert gas that is selected from the group consisting of argon, nitrogen and a combination thereof, wherein the flow rate of the oxygen-containing gas provides an oxygen partial pressure during the second time period ranging from 0 torr to 1.5 torr.

13. The method of claim 12, wherein the flow rate of the oxygen-containing gas during the second time period ranges from 0 sccm to 100 sccm for $O_2$ and 0 sccm to 5000 sccm for inert gas.

14. The method of claim 8, wherein increasing the oxygen partial pressure increases a thickness of the silicon-containing oxide layer, and wherein decreasing the oxygen partial pressure decreases the thickness of the silicon-containing oxide layer.

15. The method of claim 1, further comprising treating the silicon-containing oxide layer with a nitrogen plasma during a third time period beginning after the temperature has been reduced to room temperature, wherein the treating of the silicon-containing oxide layer with the nitrogen plasma includes a temperature ranging from room temperature to 850° C., and the nitrogen plasma introduces nitrogen to the silicon-containing oxide layer to form silicon-containing oxynitride.

16. A method of forming a silicon-containing oxynitride layer comprising:
providing a chemical oxide layer on a surface of a semiconductor substrate;
removing the chemical oxide layer in an oxygen-free environment at a temperature of 1000° C. or greater to provide a bare surface of the semiconductor substrate;
introducing a gas flow comprising an oxygen-containing gas to the bare surface of the semiconductor substrate for a first time period at the temperature of 1000° C.; and
reducing the temperature to room temperature during a second time period while maintaining the gas flow of the oxygen containing gas and introducing a nitrogen plasma to provide the silicon-containing oxynitride layer having a thickness ranging from 0.5 Å to 10 Å.

17. The method of claim 16, wherein the gas flow comprising the oxygen-containing gas and the nitrogen plasma further comprises an inert gas selected from the group consisting of argon, nitrogen and a combination thereof, wherein the flow rate of the gas flow during the first time period provides an oxygen partial pressure ranging from 0 torr to 1.5 torr.

18. The silicon oxynitride containing layer of claim 16, wherein the nitrogen plasma provides a nitrogen dose ranging from $5 \times 10^{14}$ atoms/cm$^2$ to $5 \times 10^{15}$ atoms/cm$^2$.

19. A method of forming a semiconductor device comprising:
providing a chemical oxide layer on a surface of a semiconductor substrate;
removing the chemical oxide layer in an oxygen-free environment at a temperature of 1000° C. or greater to provide a bare surface of the semiconductor substrate;
introducing an oxygen-containing gas at a flow rate to the bare surface of the semiconductor substrate for a first time period at the temperature of 1000° C. or greater; and
reducing the temperature to room temperature during a second time period while maintaining the flow rate of the oxygen containing gas of the first time period during the second time period to provide a silicon-containing oxide layer having a thickness ranging from 0.5 Å to 10 Å;
forming at least one gate conductor layer atop the silicon-containing oxide layer, wherein the at least one gate conductor layer and the silicon-containing oxide layer are patterned and etched to form a gate structure; and
forming source and drain regions on opposing sides of the gate structure.

20. The method of claim 19, wherein the oxygen-containing gas further comprises a nitrogen plasma.

* * * * *